US012720751B2

(12) United States Patent
Isogai et al.

(10) Patent No.: US 12,720,751 B2
(45) Date of Patent: Aug. 25, 2026

(54) SEMICONDUCTOR DEVICE WITH IMPROVED WRITE CHARACTERISTICS

(71) Applicant: Kioxia Corporation, Tokyo (JP)

(72) Inventors: Tatsunori Isogai, Yokkaichi Mie (JP); Fumiki Aisou, Nagoya Aichi (JP); Masaki Noguchi, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 494 days.

(21) Appl. No.: 18/178,150

(22) Filed: Mar. 3, 2023

(65) Prior Publication Data

US 2023/0413565 A1 Dec. 21, 2023

(30) Foreign Application Priority Data

Jun. 21, 2022 (JP) ................................ 2022-099939

(51) Int. Cl.
*H10B 43/30* (2023.01)
*H10B 43/27* (2023.01)

(52) U.S. Cl.
CPC ............ *H10B 43/30* (2023.02); *H10B 43/27* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20;
(Continued)

(56) References Cited

U.S. PATENT DOCUMENTS 9,960,180 B1 * 5/2018 Zhou .................... H10D 64/037
10,304,853 B2 5/2019 Daycock et al.
(Continued)

FOREIGN PATENT DOCUMENTS

CN 113497058 A 10/2021
JP 2021-150525 A 9/2021

*Primary Examiner* — William B Partridge
*Assistant Examiner* — Gustavo G Ramallo
(74) *Attorney, Agent, or Firm* — Foley & Lardner LLP

(57) ABSTRACT

A semiconductor device includes a stacked body, a semiconductor layer, a first insulating film, a first charge storage film, a second charge storage film, and a second insulating film. The stacked body includes an electrode layer and an insulating layer alternately stacked in a first direction. The semiconductor layer is disposed in the stacked body in the first direction. The first insulating film is disposed between the stacked body and the semiconductor layer. The first charge storage film is disposed between the stacked body and the first insulating film. The second charge storage film protrudes from the first charge storage film toward the electrode layer in a second direction crossing the first direction. The sum of thicknesses of the first charge storage film and the second charge storage film in the second direction is greater than a thickness of the first charge storage film in the second direction. The second insulating film is disposed between the electrode layer and the second charge storage film. A width of the second charge storage film in the first direction is greater than a width of the electrode layer in the first direction.

16 Claims, 13 Drawing Sheets

(58) Field of Classification Search
CPC ........ H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 2017/0062330 | A1* | 3/2017 | Kim .................... | H01L 23/5226 |
| 2020/0273501 | A1* | 8/2020 | Yun ........................ | H10B 43/27 |
| 2021/0296354 | A1 | 9/2021 | Uchiyama | |
| 2023/0320093 | A1* | 10/2023 | Seki ....................... | H10B 43/27<br>257/390 |

* cited by examiner

FIRST EMBODIMENT

COMPARATIVE EXAMPLE

Vpgm

SEMICONDUCTOR DEVICE WITH IMPROVED WRITE CHARACTERISTICS

CROSS-REFERENCE TO RELATED APPLICATION

This application is based upon and claims the benefit of priority from Japanese Patent Application No. 2022-099939, filed Jun. 21, 2022, the entire contents of which are incorporated herein by reference.

FIELD

Embodiments described herein relate generally to a semiconductor device and a manufacturing method thereof.

BACKGROUND

A NAND flash memory in which memory cells are disposed three-dimensionally is known as a semiconductor device. In the NAND flash memory, a memory hole penetrating a stacked body is provided in the stacked body in which a plurality of electrode layers and a plurality of insulating layers are alternately stacked. By providing a charge storage layer and a semiconductor layer in the memory hole, a memory string in which a plurality of memory cells are connected in series is formed. Data is stored in a memory cell by controlling the amount of charges stored in the charge storage layer.

DESCRIPTION OF THE DRAWINGS

FIG. 4 is a cross-sectional view illustrating a manufacturing process of the semiconductor device according to the first embodiment.

FIG. 5 is a cross-sectional view illustrating a manufacturing process of the semiconductor device according to the first embodiment.

FIGS. 14A and 14B are enlarged cross-sectional views illustrating examples of a configuration of a silicon nitride film being formed and a periphery thereof, according to the comparative example.

FIG. 15 is a schematic diagram illustrating an example of write performance.

FIG. 16 is a cross-sectional view illustrating a manufacturing process of a semiconductor device according to a modification example.

DETAILED DESCRIPTION

Figure 1A:
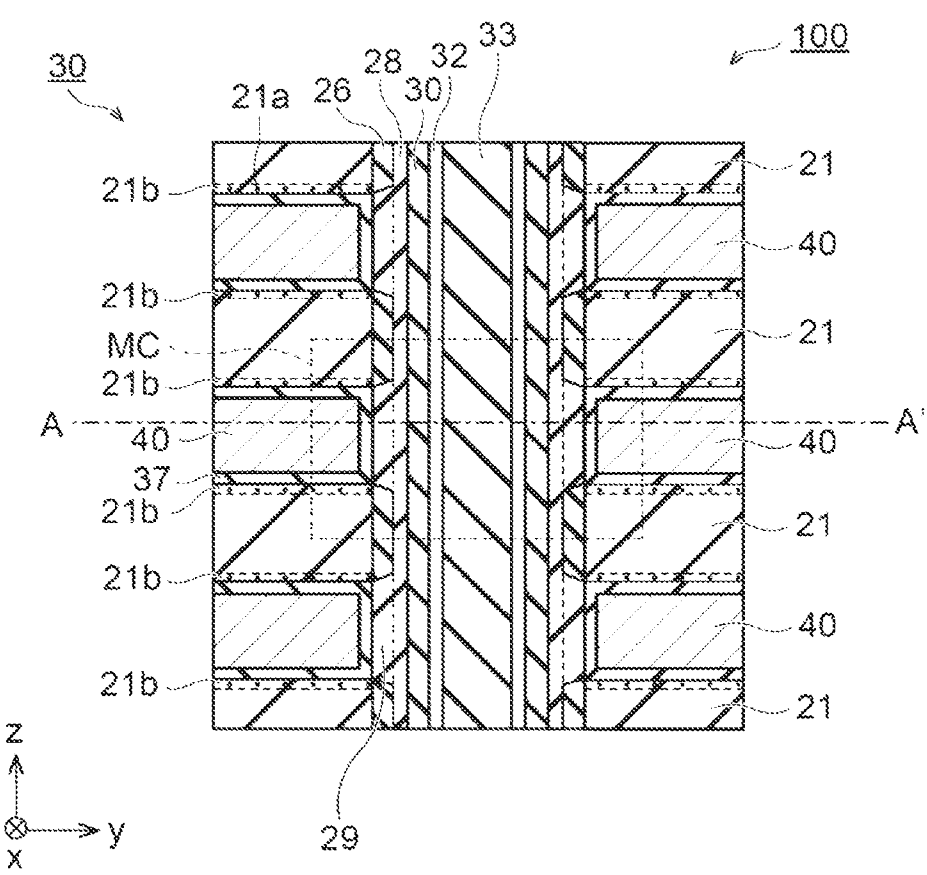
FIG. 1A is a schematic cross-sectional view of a memory cell of a semiconductor device of a first embodiment.

Embodiments provide a semiconductor device that may improve write characteristics and a manufacturing method thereof.

In general, according to at least one embodiment, a semiconductor device includes a stacked body, a semiconductor layer, a first insulating film, a first charge storage film, a second charge storage film, and a second insulating film. The stacked body includes an electrode layer and an insulating layer alternately stacked in a first direction. The semiconductor layer is disposed in the stacked body in the first direction. The first insulating film is disposed between the stacked body and the semiconductor layer. The first charge storage film is disposed between the stacked body and the first insulating film. The second charge storage film protrudes from the first charge storage film toward the electrode layer in a second direction crossing the first direction. The sum of thicknesses of the first charge storage film and the second charge storage film in the second direction is greater than a thickness of the first charge storage film in the second direction. The second insulating film is disposed between the electrode layer and the second charge storage film. A width of the second charge storage film in the first direction is greater than a width of the electrode layer in the first direction.

Hereinafter, embodiments according to the present disclosure will be described with reference to the drawings. The present embodiments do not limit the present disclosure. The drawings are schematic or conceptual, and ratios and the like of respective portions are not necessarily the same as actual ratios and the like. In the specification and drawings, the same reference numerals are attached to the same components previously described for the previous drawings, and detailed descriptions thereof are omitted as appropriate.

First Embodiment

A semiconductor device of a first embodiment is a three-dimensional NAND flash memory.

Figure 1B:
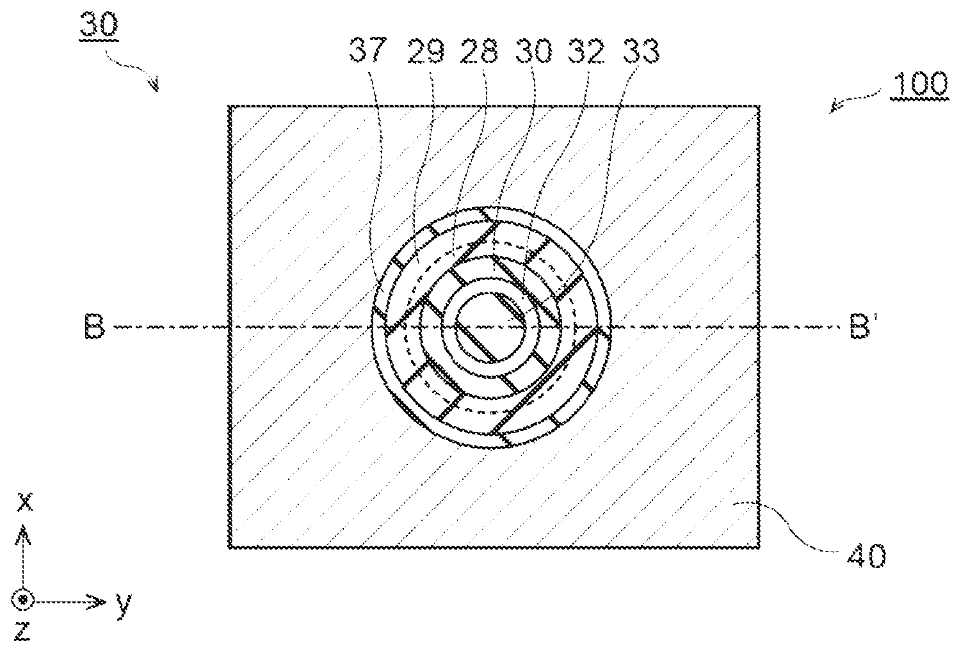
FIG. 1B is a schematic cross-sectional view of the memory cell of the semiconductor device of the first embodiment.

FIGS. 1A and 1B are schematic cross-sectional views of a memory cell array 100 of the semiconductor device of the first embodiment. FIGS. 1A and 1B illustrate cross sections of a plurality of memory cells MC in one memory string in the memory cell array 100.

FIG. 1A is an yz cross-sectional view of the memory cell array 100. FIG. 1A is a cross section taken along line B-B' of FIG. 1B. FIG. 1B is an xy cross-sectional view of the memory cell array 100. FIG. 1B is a cross section taken along line A-A' of FIG. 1A. In FIG. 1A, a region surrounded by a dashed line is one memory cell MC.

As illustrated in FIGS. 1A and 1B, the memory cell array 100 includes a plurality of word lines 40, a semiconductor layer 32, a plurality of insulating layers 21, a tunnel insulating film 30, a first charge storage film 28, a plurality of second charge storage films 29, a plurality of block films 37, a core insulating film 33, and a cover film 26. The plurality of word lines 40 and the plurality of insulating layers 21 configure a stacked body 30.

The memory cell array 100 is provided on, for example, a semiconductor substrate (not illustrated). The semiconductor substrate has surfaces parallel to an x direction and a y direction.

The word lines 40 and the insulating layers 21 are alternately stacked on the semiconductor substrate in a z direction (a first direction). The word lines 40 are spaced apart from each other in the z direction. The word lines 40 are spaced apart from each other and repeatedly disposed in the z direction. The plurality of word lines 40 and the plurality of insulating layers 21 configure a stacked body 30. The word line 40 functions as a control electrode of a memory cell transistor.

The word line 40 is a conductor of a plate shape. The word line 40 is, for example, a metal, a metal nitride, a metal carbide, or a semiconductor. The word line 40 is, for example, tungsten (W). For example, a thickness of the word line 40 in the z direction is greater than or equal to 5 nm and less than or equal to 20 nm.

The insulating layer 21 separates the word line 40 from the word line 40. The insulating layer 21 electrically separates the word line 40 from the word line 40.

The insulating layer 21 is, for example, an oxide, an oxynitride, or a nitride. The insulating layer 21 is, for example, silicon oxide. For example, a thickness of the insulating layer 21 in the z direction is greater than or equal to 5 nm and less than or equal to 20 nm.

The semiconductor layer 32 is provided in the stacked body 30. The semiconductor layer 32 extends in the z direction. The semiconductor layer 32 extends in a direction perpendicular to a surface of the semiconductor substrate.

The semiconductor layer 32 penetrates the stacked body 30. The semiconductor layer 32 is surrounded by the plurality of word lines 40. The semiconductor layer 32 has, for example, a cylindrical shape. The semiconductor layer 32 functions as a channel of a memory cell transistor.

The semiconductor layer 32 is, for example, a polycrystalline semiconductor. The semiconductor layer 32 is, for example, polycrystalline silicon.

The tunnel insulating film 30 is provided between the semiconductor layer 32 and the word line 40. The tunnel insulating film 30 is provided between the semiconductor layer 32 and the plurality of word lines 40. The tunnel insulating film 30 is provided between the semiconductor layer 32 and the second charge storage film 29. The tunnel insulating film is provided between the semiconductor layer 32 and the first charge storage film 28.

The tunnel insulating film 30 has a function of passing charges according to a voltage applied between the word line 40 and the semiconductor layer 32.

The tunnel insulating film 30 contains, for example, silicon (Si) and oxygen (O). The tunnel insulating film 30 contains, for example, silicon (Si), oxygen (O), and nitrogen (N).

The tunnel insulating film 30 contains, for example, silicon oxide or silicon oxynitride. The tunnel insulating film 30 is a stacked film of, for example, a silicon oxide film, a silicon oxynitride film, and a silicon oxide film.

For example, a thickness of the tunnel insulating film 30 in the y direction is greater than or equal to 3 nm and less than or equal to 8 nm.

The first charge storage film 28 is provided between the tunnel insulating film 30 and the second charge storage film 29. The first charge storage film 28 is provided between the tunnel insulating film 30 and the insulating layer 21. The first charge storage film 28 is in contact with the second charge storage film 29.

The first charge storage film 28 functions as a seed film when forming the second charge storage film 29 by vapor deposition.

The first charge storage film 28 contains silicon (Si) and nitrogen (N). The first charge storage film 28 contains, for example, silicon nitride. The first charge storage film 28 is, for example, a silicon nitride film.

The first charge storage film 28 contains, for example, silicon (Si), nitrogen (N), and oxygen (O). The first charge storage film 28 contains, for example, silicon oxynitride.

For example, a thickness of the first charge storage film 28 in the y direction is greater than or equal to 1 nm and less than or equal to 5 nm.

The second charge storage film 29 is provided between the tunnel insulating film 30 and the word line 40. The second charge storage film 29 is provided between the tunnel insulating film 30 and the block film 37. The plurality of second charge storage films 29 are separated from each other. The insulating layer 21 or the cover film 26 is sandwiched between two second charge storage films 29 adjacent in the z direction.

The second charge storage film 29 has a function of trapping and storing charges. The charges are, for example, electrons. A threshold voltage of a memory cell transistor changes according to the amount of charges stored in the second charge storage film 29. By using the change in threshold voltage, one memory cell MC may store data.

For example, when the threshold voltage of the memory cell transistor changes, a voltage by which the memory cell transistor is turned on changes. For example, when a state of a high threshold voltage is defined as data "0" and a state of a low threshold voltage is defined as data "1", the memory cell MC may store data with 1 bit of "0" and "1".

The second charge storage film 29 contains silicon (Si) and nitrogen (N). The second charge storage film 29 contains, for example, silicon nitride. The second charge storage film 29 is, for example, a silicon nitride layer.

The second charge storage film 29 contains, for example, silicon (Si), nitrogen (N), and oxygen (O). The second charge storage film 29 contains, for example, silicon oxynitride.

For example, a thickness of the second charge storage film 29 in the y direction is greater than the thickness of the first charge storage film 28 in the y direction. For example, the thickness of the second charge storage film 29 in the y direction is greater than or equal to 3 nm and less than or equal to 10 nm.

The block film 37 is provided between the second charge storage film 29 and the word line 40. The block film 37 is in contact with the insulating layer 21 in the z direction.

The block film 37 has a function of blocking a current flowing between the second charge storage film 29 and the word line 40.

The block film 37 contains, for example, aluminum oxide. The block film 37 is, for example, an aluminum oxide layer.

The core insulating film 33 is provided in the stacked body 30. The core insulating film 33 extends in the z direction. The core insulating film 33 penetrates the stacked body 30. The core insulating film 33 is surrounded by the semiconductor layer 32. The core insulating film 33 is surrounded by the plurality of word lines 40. The core insulating film 33 has a columnar shape. The core insulating film 33 has, for example, a round column shape.

The core insulating film 33 is, for example, an oxide, an oxynitride, or a nitride. The core insulating film 33 contains, for example, silicon oxide. The core insulating film 33 is, for example, a silicon oxide layer.

The cover film 26 is provided between the first charge storage film 28 and the insulating layer 21. The cover film 26 is in contact with the first charge storage film 28 and the insulating layer 21.

For example, a thickness of the cover film 26 in the y direction is greater than or equal to 3 nm and less than or equal to 8 nm.

A detailed configuration of the second charge storage film 29 will be described below with reference to FIG. 9.

Figure 2:
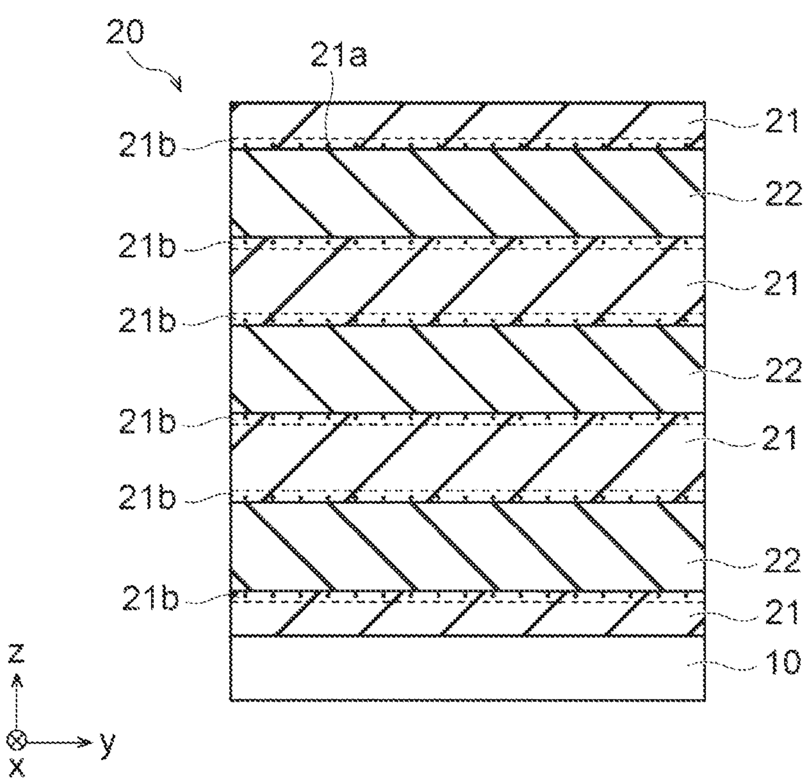
FIG. 2 is a cross-sectional view illustrating a manufacturing process of the semiconductor device according to the first embodiment.

A semiconductor device according to the first embodiment will be described with reference to FIGS. 2 to 9. The semiconductor device of the present embodiment is manufactured by, for example, a method to be described below. First, as illustrated in FIG. 2, the insulating layers 21 and the sacrificial layers 22 are alternately stacked on a semiconductor substrate 10. Thereby, a stacked body 20 stacked in the z direction (a vertical direction of the figure) is formed. The insulating layer 21 is, for example, a silicon oxide layer. The sacrificial layer 22 is, for example, a silicon nitride layer.

The insulating layer 21 and the sacrificial layer 22 are formed by, for example, a chemical vapor deposition (CVD) method. A part of the insulating layer 21 becomes an interlayer insulating layer.

In more detail, the insulating layer 21 is formed while introducing an impurity 21*a* into at least a surface of the insulating layer 21 facing the sacrificial layer 22. The impurity 21*a* is used to adjust an etching rate in a process to be described below with reference to FIG. 7. The impurity 21*a* is, for example, carbon (C). The insulating layer 21 has an impurity-containing layer 21*b* at least on a surface facing the sacrificial layer 22. The impurity-containing layer 21*b* contains the impurity 21*a* with a concentration higher than or equal to a first predetermined value. The first predetermined value is, for example, about $1\times10^{20}$ $cm^{-3}$. For example, a thickness of the impurity-containing layer 21*b* is less than or equal to 5 nm. The introduction of the impurity 21*a* is performed by causing a carbon-containing gas to flow during formation of the insulating layer 21 corresponding to the impurity-containing layer 21*b* by, for example, a CVD method. The carbon-containing gas is, for example, a hydrocarbon-based gas or a gas containing carbon and oxygen and contains at least one of methane ($CH_4$), ethylene ($C_2H_4$), propylene ($C_3H_6$), acetylene ($C_2H_2$), carbon monoxide (CO), and carbon dioxide ($CO_2$).

Figure 3:
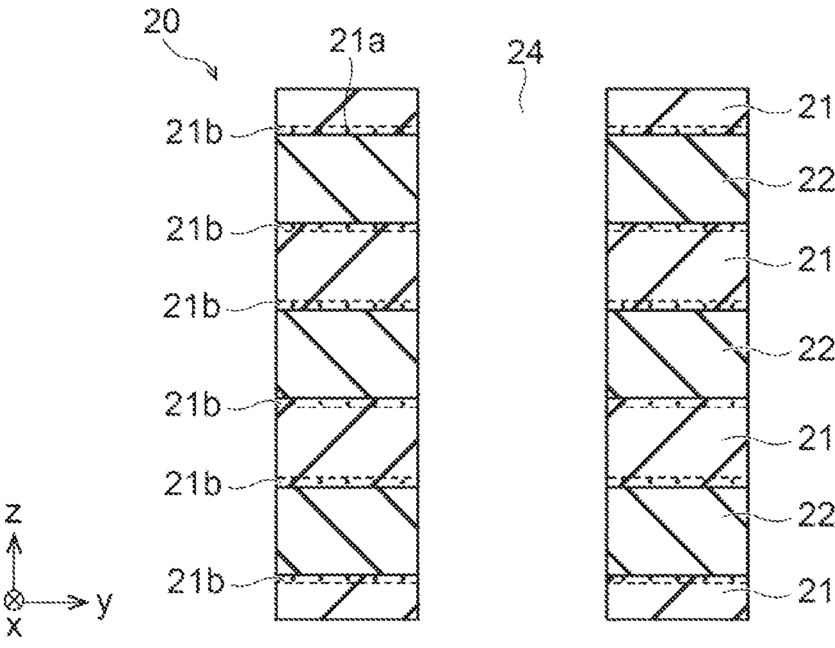
FIG. 3 is a cross-sectional view illustrating a manufacturing process of the semiconductor device of the first embodiment.

Next, as illustrated in FIG. 3, a memory hole 24 is formed in the stacked body 20 in the z direction. The semiconductor substrate 10 is omitted in FIG. 3 and beyond. This memory hole 24 penetrates the stacked body 20 that configures the insulating layer 21 and the sacrificial layer 22. The memory hole 24 is formed by using, for example, a lithography method and a reactive ion etching (RIE) method.

Figures 4, 5:
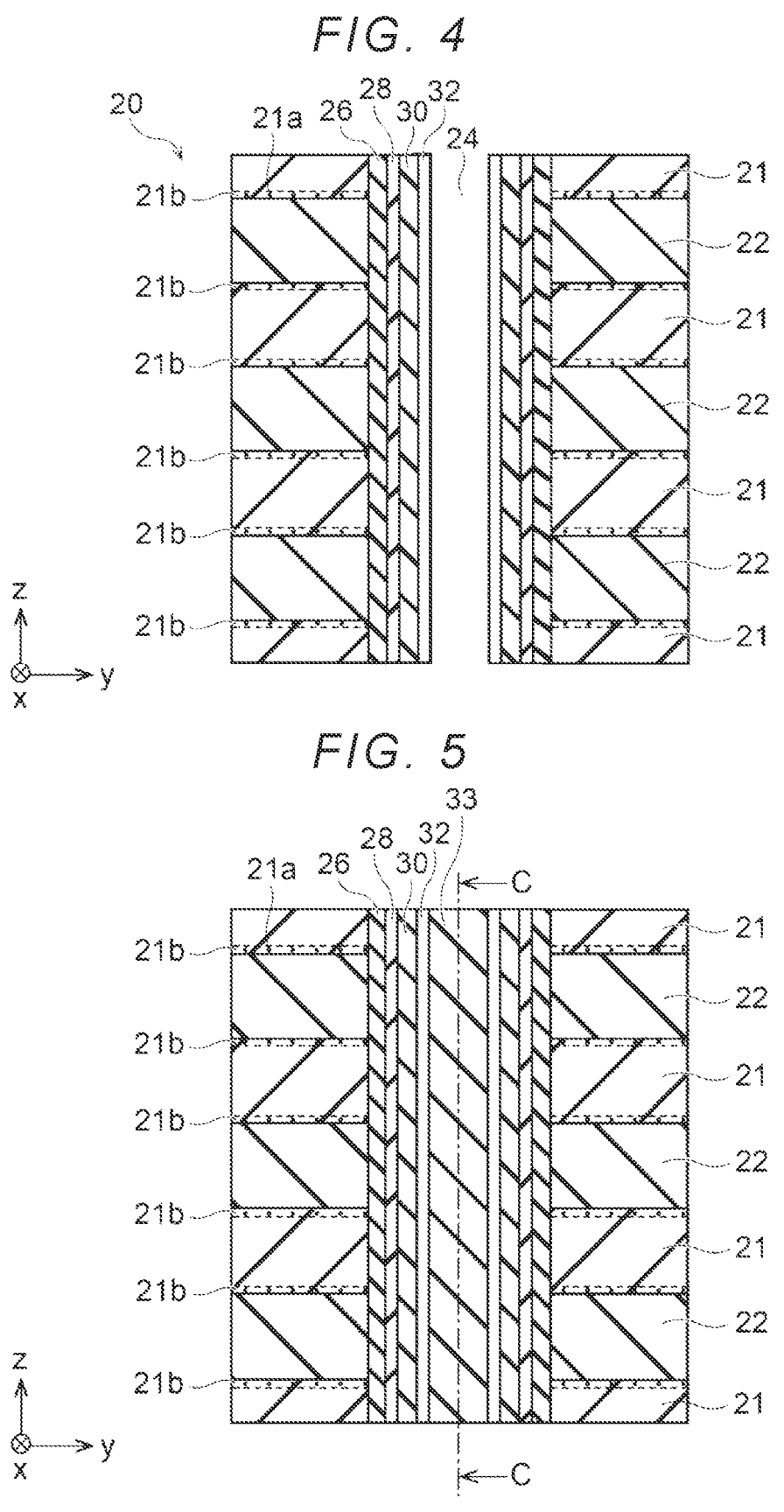

Next, as illustrated in FIG. 4, a silicon oxide film with a thickness of, for example, 2 nm is formed on an inner wall of the memory hole 24 as a stopper film (cover film) 26. A silicon nitride film with a thickness of, for example, 2 nm is formed on the cover film 26 as the first charge storage film 28 that is part of a charge storage film. A silicon oxynitride film with a thickness of, for example, 5 nm is formed on the first charge storage film 28 as the tunnel insulating film 30. The semiconductor layer 32 with a thickness of, for example, 7 nm is formed on the tunnel insulating film 30. The cover film 26, the first charge storage film 28, and the tunnel insulating film 30 are formed by, for example, a CVD method. Polysilicon is generally used as a material for the semiconductor layer 32. However, from the viewpoint of surface roughness, a method is used in which amorphous silicon is formed at a low temperature (for example, about 500° C.) and then heat-treated at, for example, 800° C. or higher to crystallize the amorphous silicon. The materials of the cover film 26, the first charge storage film 28, and the tunnel insulating film 30 are only examples, and are not limited to any material in particular as long as the material may implement a structure of the semiconductor device of the embodiments illustrated in FIGS. 1A and 1B, and FIG. 9 to be described below.

Next, as illustrated in FIG. 5, the memory hole 24 is filled with the core insulating film 33. The core insulating film 33 is, for example, a silicon oxide film. In the following description, a cross section is symmetrical to a center line C-C illustrated in FIG. 5, and accordingly, the cross section on the left side of the center line C-C will be described. The core insulating film 33 is not illustrated in the drawings that follow.

Thereafter, a groove penetrating the stacked body 20 is opened around the memory hole 14, and the sacrificial layer 22 is removed from the groove. The cover film 26 is exposed by removing the sacrificial layer 22. A heated phosphoric acid chemical solution is generally used to remove the sacrificial layer 22. Due to this chemical solution treatment, an air gap 22*a* is formed in a trace of the removed silicon nitride layer. The air gap 22*a* that traces a shape of the original sacrificial layer 22 is formed (see FIG. 6).

Figure 7:
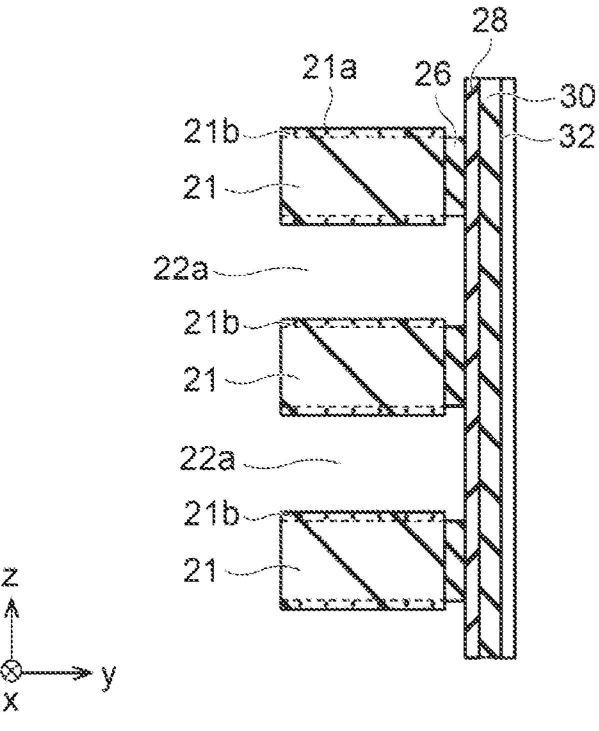
FIG. 7 is a cross-sectional view illustrating a manufacturing process of the semiconductor device according to the first embodiment.

Next, as illustrated in FIG. 7, the cover film 26 is partially removed by a hydrofluoric acid (HF) chemical solution diluted to about 0.5%. Thereby, a part of the first charge storage film 28 is exposed in the air gap 22*a*. However, a part of the cover film 26 located between the insulating layer 21 and the first charge storage film 28 remains. The amount of removal of the cover film 26 is adjusted by, for example, a processing time of wet etching.

Here, an etching rate of a surface of the insulating layer 21 is reduced by the impurity-containing layer 21*b*. For example, the etching rate of the impurity-containing layer 21*b* is lower than the etching rate of the cover film 26. Thereby, as illustrated in FIG. 7, a width of the cover film 26 in the z direction disposed between the insulating layer 21 and the first charge storage film 28 is less than the width of the insulating layer 21 in the z direction. That is, the cover film 26 containing a relatively less impurity recedes beyond an upper end or a lower end of the insulating layer 21. As a result, the first charge storage film 28 in a part of a region corresponding to the insulating layer 21 is also exposed. That is, by removing a part of the cover film 26 such that the etching rate of the cover film 26 is higher than the etching rate of the insulating layer 21, the first charge storage film 28 in a region from which the sacrificial layer 22 is removed is exposed, and the first charge storage film 28 in a part of a region corresponding to the insulating layer 21 is exposed.

Figure 8:
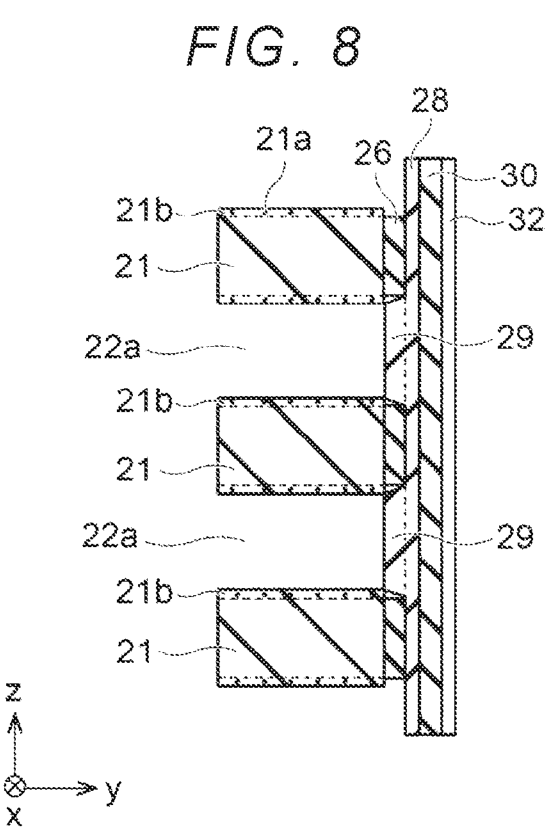
FIG. 8 is a cross-sectional view illustrating a manufacturing process of the semiconductor device according to the first embodiment.

Next, as illustrated in FIG. 8, a selective growth of a silicon nitride film that is the second charge storage film 29 is performed by using the exposed surface of the first charge storage film 28 as a base point. A growth temperature in this case is, for example, about 450° C. The charge storage film of the embodiment includes the first charge storage film 28 and the second charge storage film 29. By this processing, the second charge storage film 29, which is a part of a charge storage layer, is formed to have a thickness of about 3 nm in the y direction. Thereby, in the y direction of the air gap 22*a*, a thickness of the charge storage film in the y direction is the sum (about 4 nm to about 6 nm) of the thickness of the first charge storage film 28 (about 1 nm to about 3 nm) and the thickness of the second charge storage film 29 (about 3 nm). However, a charge storage film in a region where the second charge storage film 29 is not provided becomes the first charge storage film 28, and a thickness thereof is about 1 nm to about 3 nm. That is, the first charge storage film 28 configuring a charge storage film is continuous in an extension direction (the z direction) of the semiconductor layer 32, but the second charge storage film 29 is divided in the z direction by the cover film 26. Therefore, a pseudo-separation structure of the charge storage film is formed.

The formation of the second charge storage film 29 from the first charge storage film 28 is performed by, for example, an atomic layer deposition (ALD) method. First, a silicon raw material, which is a precursor of the second charge storage film 29, is adsorbed on a surface of the first charge storage film 28. The silicon raw material is a gas containing silicon, such as dichlorosilane ($SiH_2Cl_2$) or hexachlorodisilane ($Si_2Cl_6$). Next, ammonia, which is a nitriding agent, is caused to flow to convert the silicon raw material into silicon nitride. The process described above is repeated to form the second charge storage film 29.

Here, as illustrated in FIG. 8, an upper end and a lower end of the second charge storage film 29 may be difficult to be thicker than a central portion. This is because, for example, when the selective growth of the second charge storage film 29 is performed, in a case where an inhibitor IN that inhibits adsorption of the silicon raw material to the insulating layer 21 and the cover film 26 is used, it is considered that the inhibitor IN slightly adheres to a surface of the first charge storage film 28 near the cover film 26. Further, even when the inhibitor IN is not used, it may be more difficult to adsorb the silicon raw material onto the upper end and the lower end of the second charge storage film 29 than the central portion. In the example illustrated in FIG. 8, a cross-sectional shape of the second charge storage film 29 is a trapezoid.

Further, the second charge storage film 29 protrudes in the y direction from the first charge storage film 28 toward the stacked body 20. Accordingly, the first charge storage film 28 does not have unevenness on a surface facing the semiconductor layer 32. That is, the surface of the first charge storage film 28 facing the semiconductor layer 32 is flat. A thickness of the first charge storage film 28 in the y direction is substantially constant along the z direction. In a region where the second charge storage film 29 is provided, the charge storage film is thick in the y direction.

Figure 9:
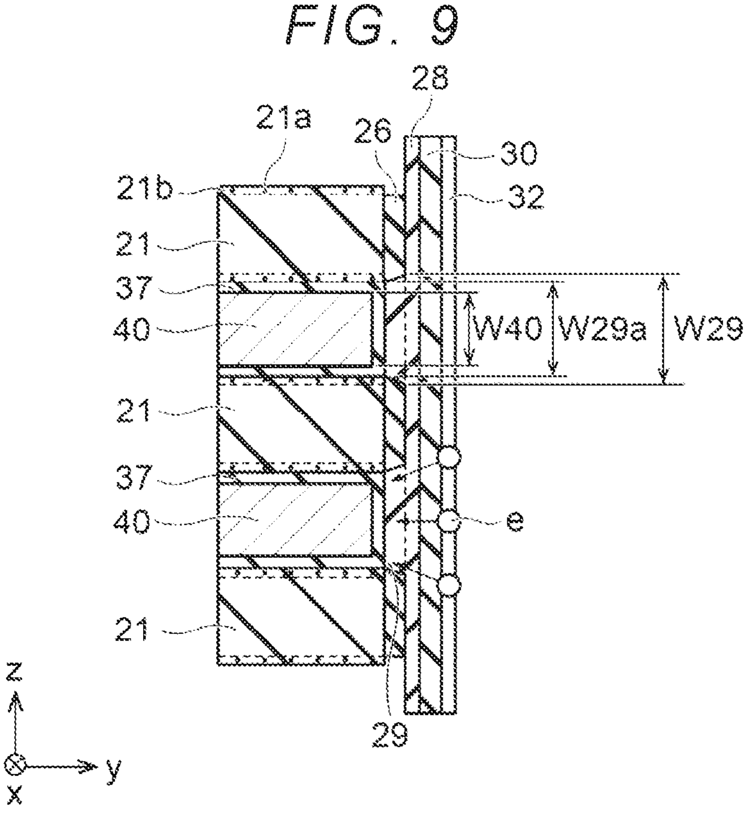
FIG. 9 is a cross-sectional view illustrating a manufacturing process of the semiconductor device according to the first embodiment.

Next, as illustrated in FIG. 9, the block film 37 containing, for example, aluminum oxide is formed so as to cover a bottom surface and a side surface of the air gap 22*a*. A barrier metal containing, for example, TiN may be formed so as to cover the block film 37.

Next, the air gap 22*a* is filled with a wiring material, such as tungsten (W), to form the word line (an electrode) 40, and thereby, a semiconductor device is completed.

As described above for a pseudo-separation structure of a charge storage film, the sum of the thicknesses of the first charge storage film 28 and the second charge storage film 29 in the y direction is greater than the thickness of the first charge storage film 28 in the y direction.

As illustrated in FIG. 9, the width in the z direction of a region where the charge storage film is thick in the y direction, that is, a width W29 of the second charge storage film 29 in the z direction is greater than a width W40 of the word line 40 in the z direction. Further, a position of the upper end of the second charge storage film 29 is recessed above a lower surface of the insulating layer 21. A position of the lower end of the second charge storage film 29 is recessed below an upper surface of the insulating layer 21.

The charge storage film has a function of trapping and storing charges e. The charges e are, for example, electrons. A threshold voltage of a memory cell transistor changes according to the amount of charges stored in the charge storage film. By using the change in threshold voltage, one memory cell may store data. An electric field is applied from the word line 40 during a write operation. A line of electric force from the word line 40 has not only a component that advances straight toward the semiconductor layer 32 serving as a channel, but also a component that spreads radially. Write characteristics can be improved by providing the second charge storage film 29 with the relatively great width W29.

Further, in more detail, the width W29*a* in the z direction of a portion of the second charge storage film 29 having a surface on a side of the word line which is substantially parallel to the first charge storage film 28 is greater than the width W40 of the word line 40 in the z direction. A width W29*a* is a width of a portion of the second charge storage film 29 excluding the bottom of a trapezoid in cross section and is a width of a portion where the second charge storage film 29 is formed thick. Thereby, the write characteristics can be further improved.

Further, in more detail, the width W29*a* is greater than the width W40 of the corresponding word line 40 by 2 nm or more on one side and by 2 nm or more on the other side. The width W40 may be a width including a barrier metal.

As described above, in the first embodiment, the sum of thicknesses of the first charge storage film 28 and the second charge storage film 29 in the y direction is greater than the thickness of the first charge storage film 28 in the y direction. Further, the width W29 of the second charge storage film 29 in the z direction is greater than the width W40 of the word line 40 in the z direction. As described above, the write characteristics can be improved by providing the second charge storage film 29 with the relatively great width W29.

Further, the first charge storage film 28 is continuous in a direction (the z direction) in which the semiconductor layer 32 serving as the channel extends, but the second charge storage film 29 is divided by the insulating layer 21 and the cover film 26 in a direction (the z direction) in which the semiconductor layer 32 serving as the channel extends, and thus, it is possible to reduce escape of electric charges in a direction (the z direction) in which the semiconductor layer 32 serving as the channel extends. Thereby, according to the present embodiment, it is possible to prevent charge storage characteristics from being reduced.

Comparative Example

A semiconductor device according to a comparative example will be described with reference to FIGS. 10 to 13. The comparative example differs from the first embodiment in that the impurity 21*a* is not provided.

First, a stacked body 20 and a memory hole 24 are formed, and a cover film 26, a first charge storage film 28, a tunnel insulating film 30, a semiconductor layer 32, and a silicon oxide film 34 are formed in the memory hole 24, in the same manner as FIGS. 2 to 5 of the first embodiment. In the comparative example, the impurity 21*a* is not introduced into the insulating layer 21 in the process of FIG. 2.

Figure 6:
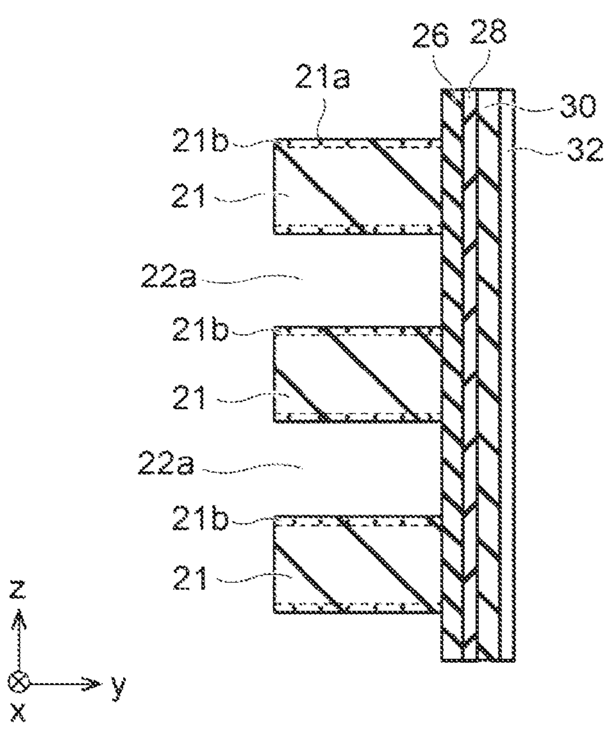
FIG. 6 is a cross-sectional view illustrating a manufacturing process of the semiconductor device according to the first embodiment.
Figure 10:
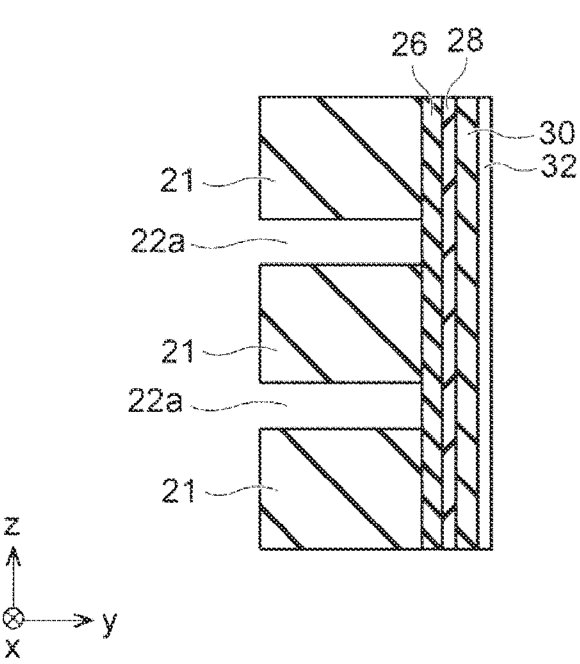
FIG. 10 is a cross-sectional view illustrating a manufacturing process of a semiconductor device according to a comparative example.

Next, as illustrated in FIG. 10 corresponding to FIG. 6 of the first embodiment, a sacrificial layer 22 is removed.

Figure 11:
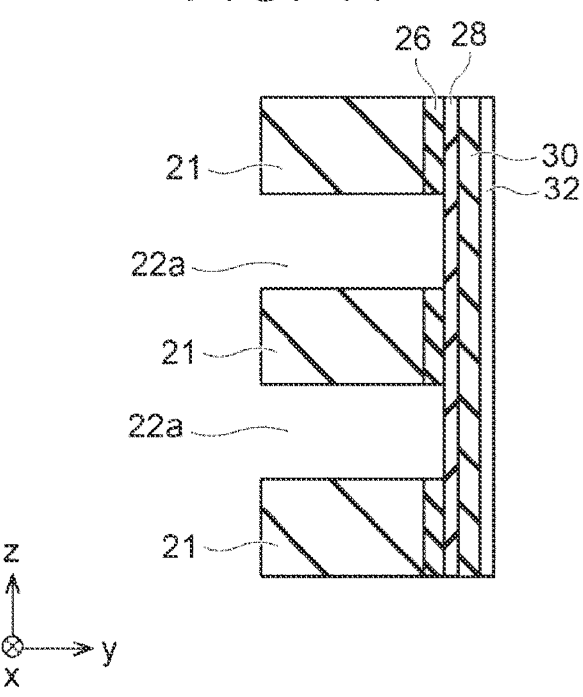
FIG. 11 is a cross-sectional view illustrating a manufacturing process of the semiconductor device of the comparative example.

Next, as illustrated in FIG. 11, the cover film 26 is removed by, for example, a hydrofluoric acid (HF) chemical solution diluted to about 0.5%. Thereby, the first charge storage film 28, which is a part of a charge storage film, is exposed at the bottom of an air gap 22*a*. Further, the insulating layer 21 is partially removed together with the cover film 26. In the example illustrated in FIG. 11, the cover film 26 is removed such that positions of a lower end and an upper end of the cover film 26 are respectively substantially the same as positions of a lower end and an upper end of the insulating layer 21. Accordingly, the first charge storage film 28 in a region corresponding to the insulating layer 21 is not exposed.

Figure 12:
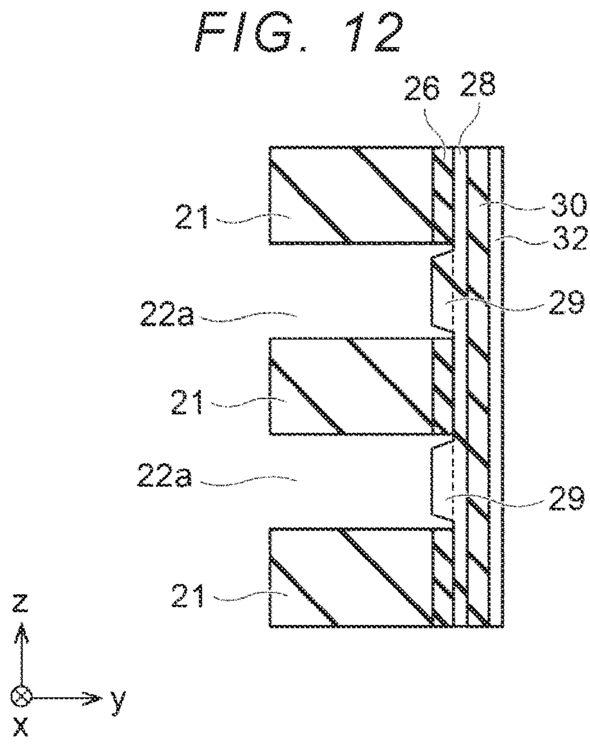
FIG. 12 is a cross-sectional view illustrating a manufacturing process of the semiconductor device of the comparative example.

Next, as illustrated in FIG. 12, a selective growth of the second charge storage film 29 is performed by using the exposed surface of the first charge storage film 28 (seed film) as a base point. The process illustrated in FIG. 12 is the same as the process illustrated in FIG. 8.

Figure 13:
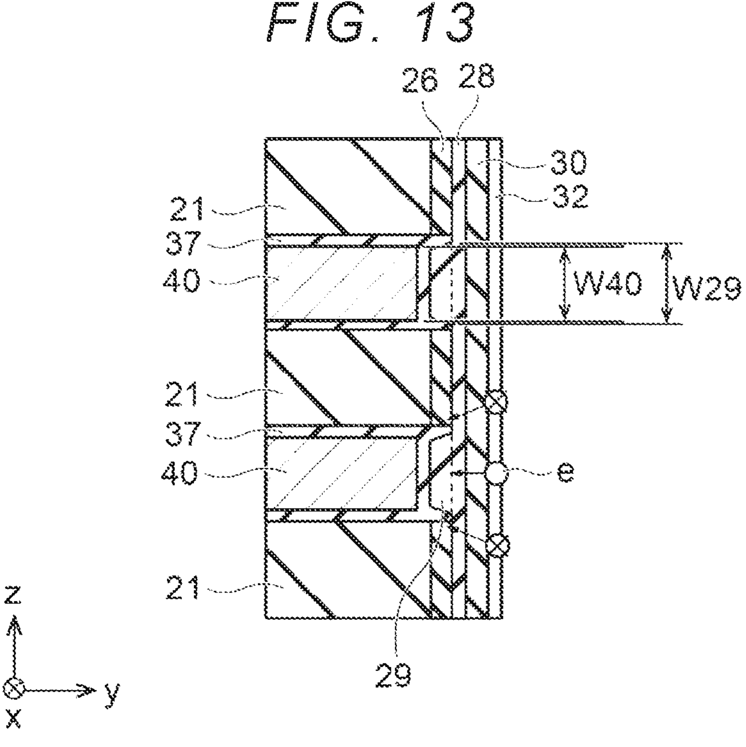
FIG. 13 is a cross-sectional view illustrating a manufacturing process of the semiconductor device of the comparative example.

Next, as illustrated in FIG. 13, a block film 37 and a word line (an electrode) 40 are formed in the air gap 22*a*, and thereby, a semiconductor device is completed. A barrier metal containing, for example, TiN may be formed before the word line 40 is formed. The process illustrated in FIG. 13 is the same as the process illustrated in FIG. 9.

In the example illustrated in FIG. 13, a region where the charge storage film is thick in the y direction, that is, a width W29 of the second charge storage film 29 in the z direction is substantially the same as a width W40 of the word line 40 in the z direction. Further, the width W29*a* in the z direction of a portion of the second charge storage film 29 having a surface on a side of the word line 40 which is substantially parallel to the first charge storage film 28 is less than the width W40. In this case, writing is difficult due to radially spreading components of lines of electric force from the word line 40. That is, an electric field applied from the word line 40 to the charge storage film is weakened at an upper end and a lower end of the word line 40 due to a pseudo-separation structure of the charge storage film, and thus, write efficiency is reduced (slope degradation and write saturation).

Figures 14A, 14B:
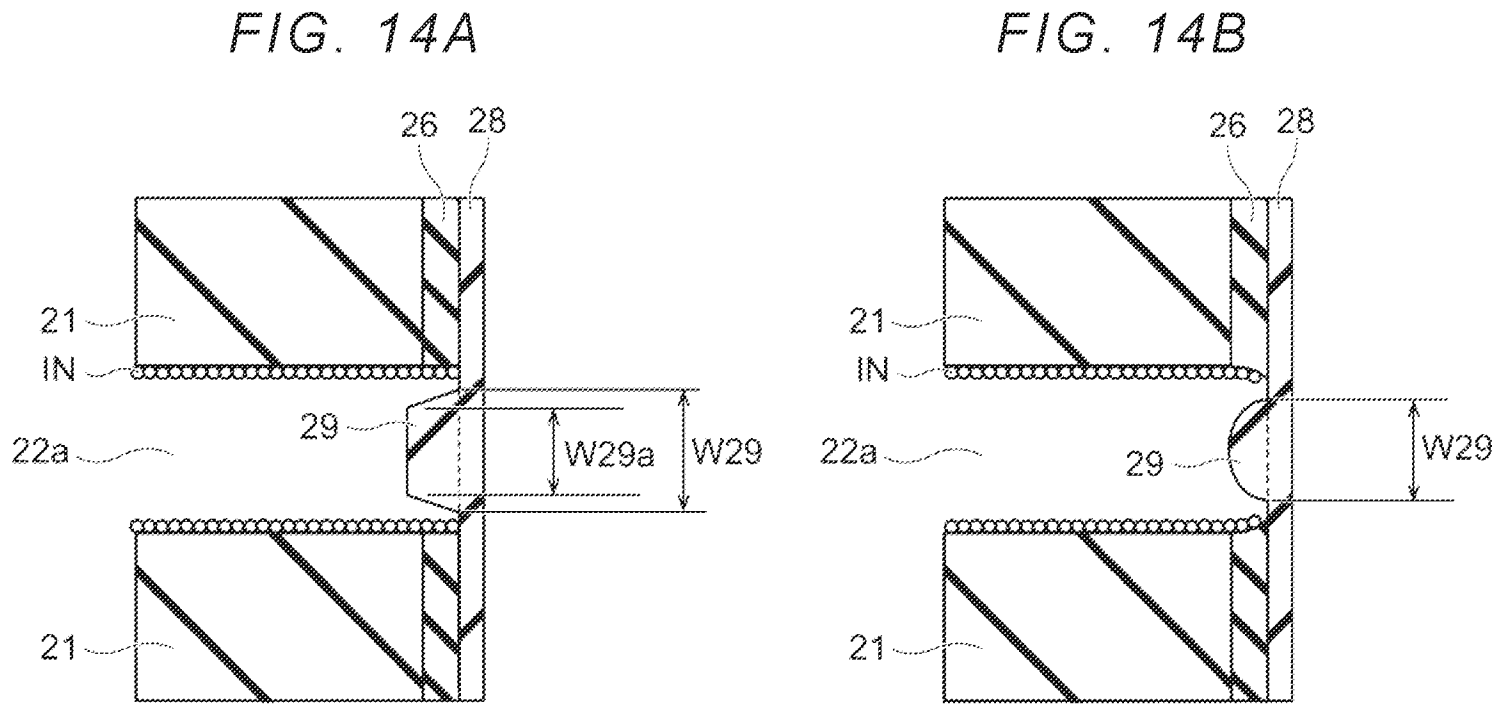

FIGS. 14A and 14B are enlarged cross-sectional views illustrating examples of a configuration of the second charge storage film 29 being formed and a periphery thereof according to a comparative example. FIG. 14A is an enlarged view of the second charge storage film 29 illustrated in FIG. 12. FIG. 14B is an enlarged view of the second charge storage film 29 when removal of the cover film 26 in the z direction is insufficient.

As described with reference to FIG. 8, the inhibitor IN is slightly present in a region near the cover film 26 in the first charge storage film 28, and it is difficult to form the second charge storage film 29. As illustrated in FIG. 14A, when removal of the cover film 26 in the z direction is insufficient, an upper end and a lower end of the second charge storage film 29 are thinned more easily. As a result, a cross-sectional shape of the second charge storage film 29 may change from a trapezoid to a convex lens shape. In this case, the charge storage film is thinned in the y direction, and the width W29 is further reduced. Further, the width W29*a* is substantially zero. Accordingly, the write characteristics described above are further reduced. Although a selective growth of the second charge storage film 29 using the inhibitor IN is described with reference to FIGS. 14A and 14B, the second charge storage film 29 may be formed without using the inhibitor IN as long as a silicon nitride film may be selectively grown on a silicon nitride film.

Figure 15:
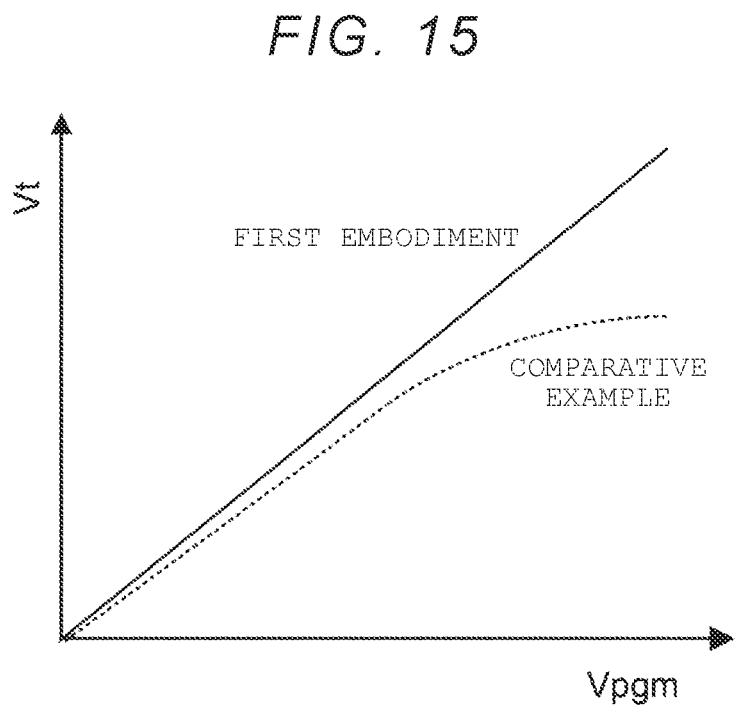

FIG. 15 is a schematic diagram illustrating an example of write performance. A vertical axis of the graph in FIG. 15 indicates a written voltage Vt. A horizontal axis of the graph in FIG. 15 indicates a write voltage Vpgm.

In the comparative example described with reference to FIG. 13, the width W29 or the width W29*a* is relatively small, and thus, write characteristics are reduced. As a result, as illustrated in FIG. 15, an increase in the written voltage Vt may slow down with respect to an increase in the write voltage Vpgm.

Meanwhile, in the first embodiment described with reference to FIG. 9, the width W29 or the width W29*a* is relatively great, and thus, write characteristics may be reduced. As a result, as illustrated in FIG. 15, the written voltage Vt follows an increase of the write voltage Vpgm.

Modification Example

Figure 17:
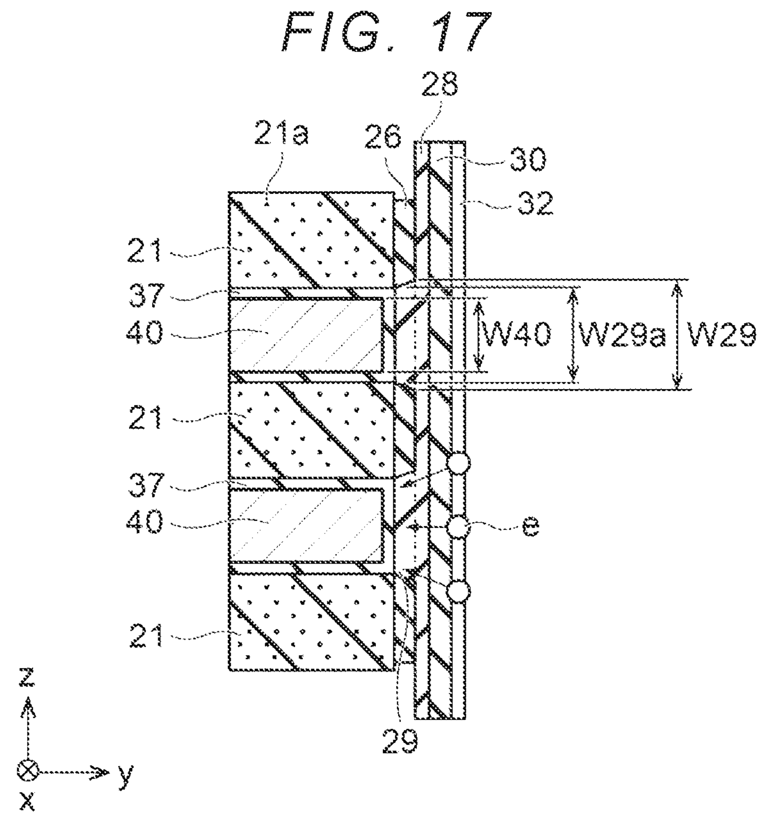
FIG. 17 is a cross-sectional view illustrating a manufacturing process of the semiconductor device of the modification example.

A semiconductor device according to a modification example will be described with reference to FIGS. 16 and 17. The modification example differs from the first embodiment in the arrangement of the impurity 21*a* in insulating layers 21.

Figure 16:
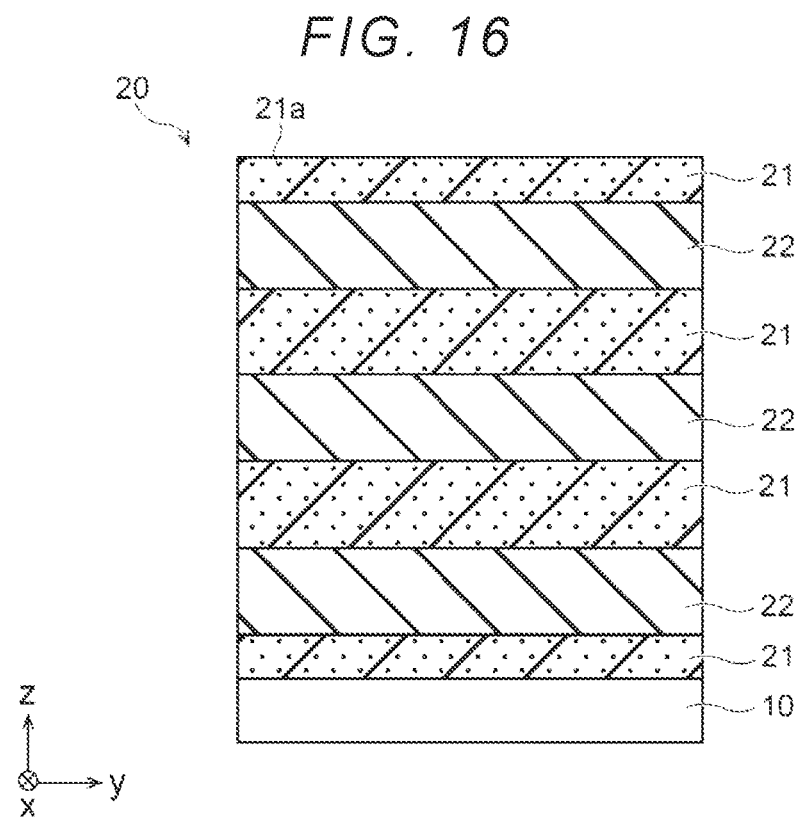

First, as illustrated in FIG. 16, the insulating layers 21 and the sacrificial layers 22 are alternately stacked on a semiconductor substrate 10. In the example illustrated in FIG. 16, the insulating layers 21 are formed such that the impurity 21*a* is provided almost entirely in the insulating layers 21. For example, introduction of the impurity 21*a* is performed by causing a carbon-containing gas to flow during formation of the insulating layer 21 by a CVD method.

Thereafter, processes are performed in the same manner as illustrated in FIGS. 3 to 9. As illustrated in FIG. 17 corresponding to FIG. 9 of the first embodiment, block films 37 and word lines 40 are formed in air gaps 22*a*, and thereby, a semiconductor device is completed. A barrier metal containing, for example, TiN may be formed before the word lines 40 are formed.

The impurity 21*a* may be disposed almost entirely in the insulating layer 21 as in the modification example. Thereby, an etching rate of the insulating layer 21 may be reduced as in the first embodiment illustrated in FIG. 7.

The semiconductor device according to the modification example may obtain the same effect as the first embodiment.

Second Embodiment

A semiconductor device according to a second embodiment will be described with reference to FIGS. 18 to 20. The second embodiment differs from the first embodiment in timing at which an impurity 21*a* is introduced.

Figures 18, 19:
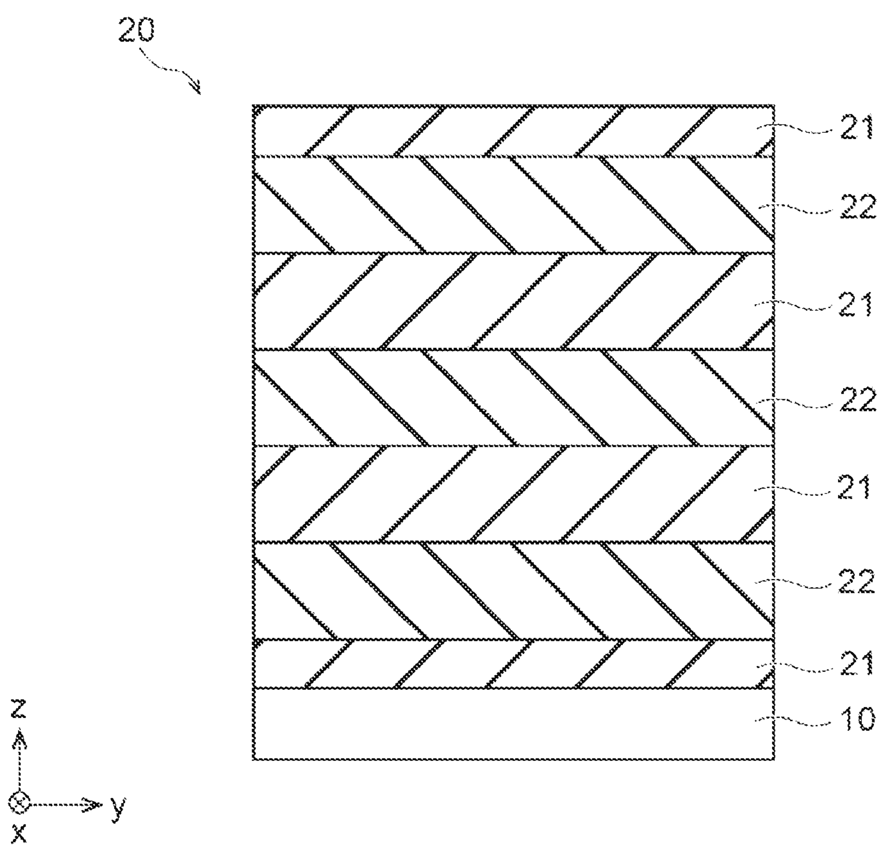
FIG. 18 is a cross-sectional view illustrating a manufacturing process of a semiconductor device according to a second embodiment.
FIG. 19 is a cross-sectional view illustrating a manufacturing process of the semiconductor device of the second embodiment.

First, as illustrated in FIG. 18, insulating layers 21 and sacrificial layers 22 are alternately stacked on a semiconductor substrate 10. In the example illustrated in FIG. 18, the impurity 21*a* is not introduced into the insulating layers 21.

Thereafter, processes are performed in the same manner as illustrated in FIGS. 3 to 6. The sacrificial layers 22 are removed as illustrated in FIG. 19 corresponding to FIG. 6 of the first embodiment.

Figure 20:
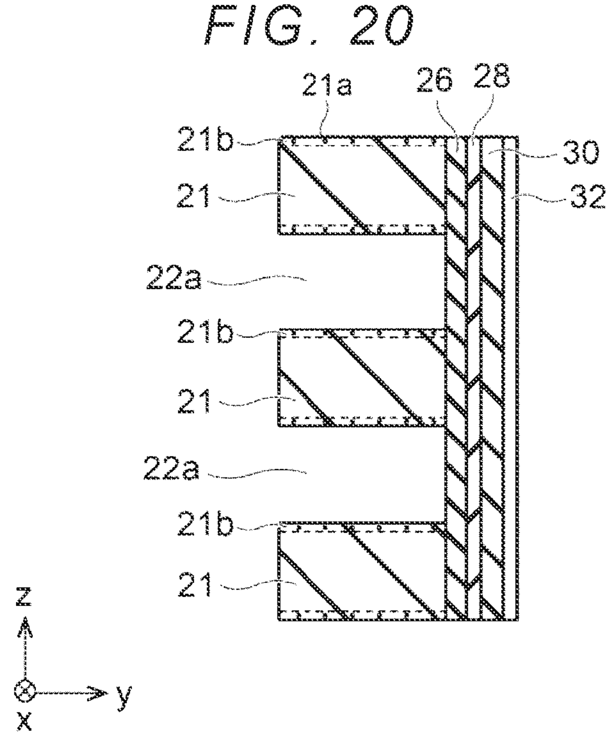
FIG. 20 is a cross-sectional view illustrating a manufacturing process of the semiconductor device of the second embodiment.

Next, as illustrated in FIG. 20, the impurity 21*a* is introduced into surfaces of the insulating layers 21 to form impurity-containing layers 21*b*. That is, the impurity 21*a* is selectively introduced, with respect to a cover film 26, into the surfaces of the insulating layers 21 exposed by removing the sacrificial layers 22. For example, films containing impurity 21*a* is selectively formed on the insulating layer 21 with respect to the cover film 26, and then annealing is performed. Thereby, the impurity-containing layers 21*b* are formed. Thereafter, processes are performed in the same manner as in FIG. 7 and beyond according to the first embodiment.

As described in the second embodiment, the impurity 21*a* may be introduced into the insulating layers 21 after the sacrificial layers 22 are removed. The semiconductor device according to the second embodiment may obtain the same effect as in the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
- a stacked body including an electrode layer and an insulating layer alternately stacked in a first direction;
- a semiconductor layer disposed in the stacked body in the first direction;
- a first insulating film disposed between the stacked body and the semiconductor layer;
- a first charge storage film disposed between the stacked body and the first insulating film;
- a second charge storage film protruding from the first charge storage film toward the electrode layer in a second direction, the second direction crossing the first direction;
- a second insulating film disposed between the electrode layer and the second charge storage film;
- a third insulating film disposed between the insulating layer and the first charge storage film,
- wherein a sum of thicknesses of the first charge storage film and the second charge storage film in the second direction is greater than a thickness of the first charge storage film in the second direction,
- a width of the second charge storage film in the first direction is greater than a width of the electrode layer in the first direction, and
- wherein a width of the third insulating film in the first direction is less than a width of the insulating layer in the first direction.

2. The semiconductor device according to claim 1, wherein the first charge storage film has a flat surface facing the semiconductor layer.

3. The semiconductor device according to claim 1, wherein a width in the first direction of a portion of the second charge storage film is greater than the width of the electrode layer in the first direction, and the portion of the second charge storage film having a surface on a side of the electrode layer which is substantially parallel to the first charge storage film.

4. The semiconductor device according to claim 3, wherein the width in the first direction of the portion of the second charge storage film having the surface on the side of the electrode layer which is substantially parallel to the first charge storage film is greater than the width of the corresponding electrode layer in the first direction by 2 nm or more on a top side and by 2 nm or more on a bottom side.

5. The semiconductor device according to claim 1, wherein the insulating layer has an impurity on a surface facing at least the electrode layer, the impurity having a concentration greater than or equal to a first predetermined value.

6. The semiconductor device according to claim 5, wherein the first predetermined value is $1\times10^{20}$ $cm^{-3}$.

7. The semiconductor device according to claim 5, wherein the insulating layer has an impurity entirely within the insulating layer.

8. The semiconductor device according to claim 1, wherein a thickness of the first charge storage film in the second direction is 1 nm to 3 nm, and the sum of the thicknesses of the first charge storage film and the second charge storage film in the second direction is 4 nm to 6 nm.

9. The semiconductor device according to claim 1, wherein the insulating layer is formed of an oxide, an oxynitride, or a nitride.

10. The semiconductor device according to claim 1, wherein the semiconductor device includes a NAND memory.

11. The semiconductor device according to claim 1, wherein the semiconductor layer includes a channel of a transistor.

12. The semiconductor device according to claim 1, wherein the first charge storage film and the second charge storage film are formed of silicon nitride.

13. The semiconductor device according to claim 1, wherein the first charge storage film is a seed film for the second charge storage film.

14. A semiconductor device comprising:
- a stacked body including an electrode layer and an insulating layer alternately stacked in a first direction;
- a semiconductor layer disposed in the stacked body in the first direction;
- a first insulating film disposed between the stacked body and the semiconductor layer;
- a first charge storage film disposed between the stacked body and the first insulating film;
- a second charge storage film protruding from the first charge storage film toward the electrode layer in a second direction, the second direction crossing the first direction; and
- a second insulating film disposed between the electrode layer and the second charge storage film,
- wherein a sum of thicknesses of the first charge storage film and the second charge storage film in the second direction is greater than a thickness of the first charge storage film in the second direction, a width of the second charge storage film in the first direction is greater than a width of the electrode layer in the first direction, wherein a width in the first direction of a portion of the second charge storage film is greater than the width of the electrode layer in the first direction, the portion of the second charge storage film having a surface on a side of the electrode layer which is substantially parallel to the first charge storage film, and the width in the first direction of the portion of the second charge storage film having the surface on the side of the electrode layer which is substantially parallel to the first charge storage film is greater than the width of the corresponding electrode layer in the first direction by 2 nm or more on a top side and by 2 nm or more on a bottom side.

15. The semiconductor device according to claim 14, further comprising:

a third insulating film disposed between the insulating layer and the first charge storage film wherein a width of the third insulating film in the first direction is less than a width of the insulating layer in the first direction.

16. The semiconductor device according to claim 14, wherein the insulating layer has an impurity on a surface facing at least the electrode layer, the impurity having a concentration greater than or equal to a first predetermined value.

* * * * *